United States Patent [19]
Weeks, Jr. et al.

[11] Patent Number: 5,914,156
[45] Date of Patent: *Jun. 22, 1999

[54] METHOD FOR COATING A CARBONACEOUS MATERIAL WITH A MOLYBDENUM CARBIDE COATING

[75] Inventors: Joseph K. Weeks, Jr., Salt Lake City; Jared L. Sommer, North Salt Lake, both of Utah

[73] Assignee: Technical Research Associates, Inc., Salt Lake City, Utah

[*] Notice: This patent is subject to a terminal disclaimer.

[21] Appl. No.: 08/800,225

[22] Filed: Feb. 12, 1997

Related U.S. Application Data

[62] Division of application No. 08/433,221, May 2, 1995, abandoned.

[51] Int. Cl.⁶ .............................. B05D 1/18; C23C 16/32
[52] U.S. Cl. ..................... 427/431; 427/383.3; 427/249; 427/255.4
[58] Field of Search .............................. 427/249, 255.4, 427/431, 383.3

[56] References Cited

U.S. PATENT DOCUMENTS

| | | | |
|---|---|---|---|
| 5,244,748 | 9/1993 | Weeks, Jr. et al. | 428/614 |
| 5,410,796 | 5/1995 | Weeks, Jr. | 29/419.1 |

OTHER PUBLICATIONS

Pierson, e "Handbook of Chemical Vapor Deposition (CVD) Principles, Technology and Applications", Noyes Publications, 1992, pp. 214–215.

*Primary Examiner*—Roy V. King
*Attorney, Agent, or Firm*—J. Winslow Young

[57] ABSTRACT

A carbonaceous material coated with a molybdenum carbide coating, the molybdenum carbide coating protecting the carbonaceous material against attack by molten metal while simultaneously providing a wetting action for the molten metal to infiltrate the carbonaceous material. The carbonaceous material is any suitable carbonaceous material such as diamond; graphite fibers, both continuous and discontinuous; carbon and graphite particulate; lampblack; and carbon-rich surfaces. The molybdenum carbide coating is produced by reacting a gaseous molybdenum compound with the surface of the carbonaceous material under a reducing atmosphere. The molybdenum carbide coated carbonaceous material is formed into a metal/carbonaceous material composite by being heated with the metal under an inert atmosphere until the molten metal infiltrates the molybdenum carbide coated carbonaceous material. The metals include copper, aluminum, magnesium, iron, nickel, cobalt, titanium, silver, gold, platinum, rhodium, tin, zinc, and alloys of these metals.

4 Claims, 2 Drawing Sheets

METHOD FOR COATING A CARBONACEOUS MATERIAL WITH A MOLYBDENUM CARBIDE COATING

RELATED APPLICATIONS

This application is a Divisional Application of our application Ser. No. 08/433,221 filed May 2, 1995, now abandoned for MOLYBDENUM CARBIDE COATED CARBONACEOUS MATERIALS AND METAL COMPOSITES OF THE SAME.

BACKGROUND

1. Field of the Invention

This invention relates to carbonaceous materials and, more particularly, to carbonaceous materials coated with molybdenum carbide and metal composites of the same.

2. The Prior Art

Carbonaceous materials exhibit valuable characteristics depending upon the particular type of carbonaceous material. These carbonaceous materials include all forms of carbon such as diamond, graphite, amorphous forms of carbon such as lampblack, and even carbon-rich surfaces. Each of these forms of carbon are generally available in particulate shapes while graphite can be found in a variety of forms including fibers, both continuous and discontinuous, as well as flakes and particulates. The carbon-rich surfaces can, in turn, be prepared from a substrate in the form of fibers and particulates as well as any predetermined shape having thereon the carbon-rich surface.

The physical and chemical characteristics of carbon depends upon the atomic structure of each. For example, in diamond the atoms are arranged in such a way that each carbon atom is at the center of a regular tetrahedron and is bonded to four other carbon atoms, each of which lies at the corners of the tetrahedron. Diamond thus is formed with its carbon atoms bonded together as a series of interlacing hexagons with each carbon atom covalently linked to four others. This accounts for diamond being well known for its extreme hardness. On the other hand, the graphite form of carbon consists of sheets or planes of covalently linked carbon atoms, but these sheets are almost too far apart for them to have real chemical bonds between the carbon atoms in different planes. This structure accounts for the readiness with which graphite can be cleaved along these planes as well as its softness and lubricating power.

Charcoal and amorphous forms of carbon in general are found to possess a graphite-like structure but the planes are much smaller and arranged in an irregular manner. This accounts for the greater reactivity but also lends support to the view that amorphous carbon is not a distinct allotropic form.

Graphite fibers could also be considered to be another form of carbon due to their unique properties, primary of which is its high modulus or stiffness as well as elasticity and strength. Certain graphite fibers also have high thermal conductivity which makes these graphite fibers uniquely qualified for uses that can benefit from these features. Another advantage is that graphite fibers are relatively light weight which means that when incorporated into a composite they will significantly reduce the specific gravity of that composite while at the same time contributing to the overall strength and thermal conductivity of the composite. Graphite fiber also has a very low coefficient of thermal expansion which means that a composite having graphite fibers therein should have a correspondingly low coefficient of thermal expansion.

Probably the greatest obstacle to the use of these carbonaceous materials in any of their various forms in matrices, particularly metal matrices, is their rather high degree of reactivity with oxygen and most molten metals especially at the melting temperatures of these metals. Another significant problem is that these carbonaceous materials are difficult to wet with some molten metals unless special wetting agents are used. However, many metals readily react with the graphite fibers and thereby "wet" the graphite fibers albeit at the expense of the graphite fibers since this reaction significantly degrades the graphite fibers. Therefore, a number of patents have been granted for inventions involving the production of graphite fiber-metal composites wherein various coatings have been applied to the graphite fibers.

However, none of these references either disclose or suggest the novel technique of protecting carbonaceous materials by coating them with molybdenum carbide. We have discovered that we can produce a protective coating of molybdenum carbide on carbonaceous materials to both protect the carbonaceous materials against attack by the molten metals while simultaneously providing the surface of the carbonaceous materials with a wetting action for the thorough wetting of the carbonaceous materials with molten metal. The carbonaceous materials include all forms of carbon such as diamond; graphite fibers, both continuous and discontinuous; graphite particulate, lampblack, and even carbon-rich surfaces such as a carbon-coated silicon carbide. These molybdenum carbide coated carbonaceous materials can then be incorporated into selected metal matrices. These metals include copper, aluminum, magnesium, iron, nickel, cobalt, titanium, silver, gold, platinum, rhodium, tin, zinc, and alloys of these metals. Such a novel invention is disclosed and claimed herein.

BRIEF DESCRIPTION AND OBJECTS OF THE INVENTION

This invention involves the unique discovery that carbonaceous materials can be protected by a coating of molybdenum carbide. These carbonaceous materials include all forms of carbon such as diamond; graphite fibers, both continuous and discontinuous, graphite particulate, lampblack, and even carbon-rich surfaces. Not only does the molybdenum carbide coating protect these carbonaceous materials it also provides a wetting surface to allow these materials to be used in a matrix formed with the metals of copper, aluminum, magnesium, iron, nickel, cobalt, titanium, silver, gold, platinum, rhodium, tin, zinc, and alloys of these metals.

It is, therefore, a primary object of this invention to provide improvements in coatings for carbonaceous materials.

It is another object of this invention to provide improvements in the method of protecting carbonaceous materials.

Another object of this invention is to provide a carbonaceous material with a protective coating that not only protects the carbonaceous material but provides improved wetting between the coated carbonaceous material and a metal matrix, the metal for the metal matrix being selected from the metals of copper, aluminum, magnesium, iron, nickel, cobalt, titanium, silver, gold, platinum, rhodium, tin, zinc, and alloys of these metals.

Another object of this invention is to provide a coating for carbonaceous materials that protects the carbonaceous materials from attack by molten metals used to infiltrate a matrix of the carbonaceous materials.

These and other objects and features of the present invention will become more readily apparent from the following description in which preferred and other embodiments of the invention have been set forth in conjunction with the accompanying drawing and appended claims.

DETAILED DESCRIPTION OF THE PREFERRED EMBODIMENTS

Figure 1:
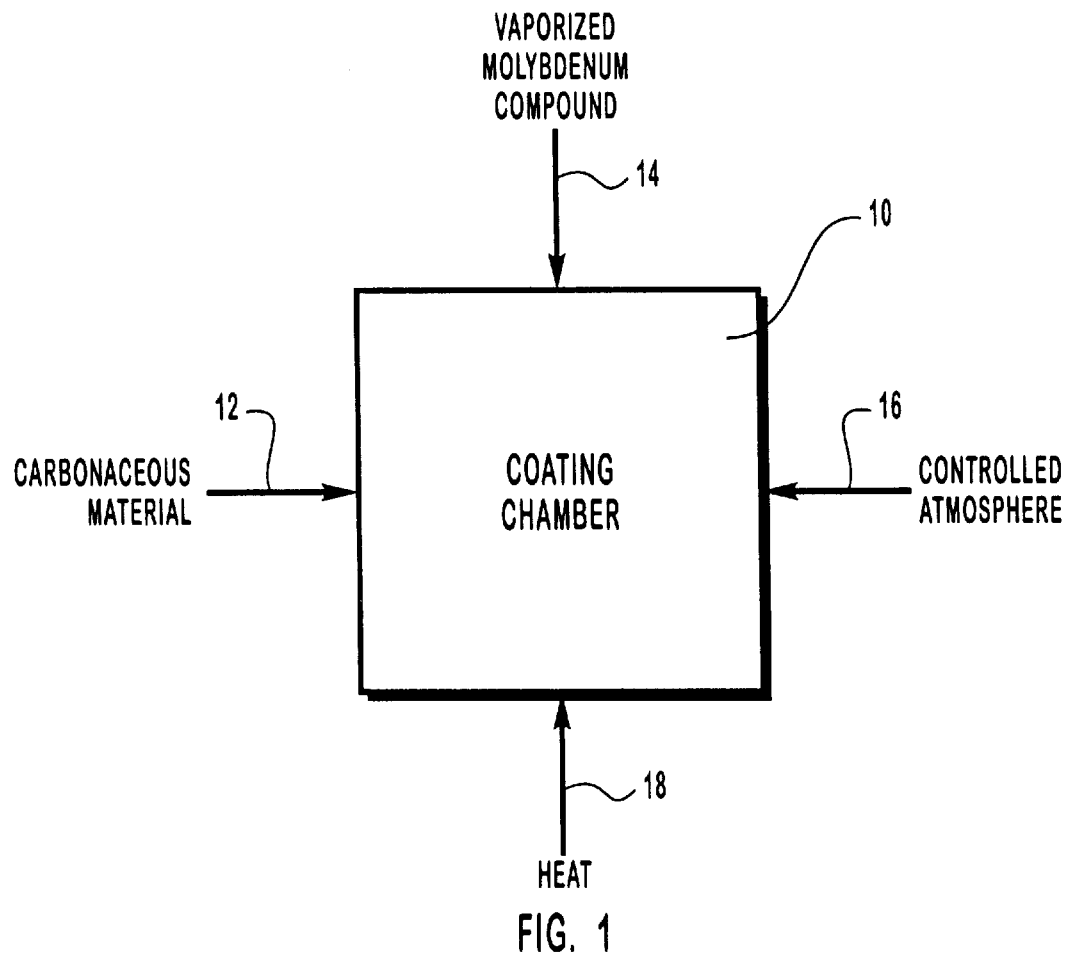
FIG. 1 is a schematic illustration of one presently preferred embodiment of the coating apparatus for coating the carbonaceous materials with molybdenum carbide.

The invention is best understood from the following description with reference to the drawing wherein like parts are designated by like numerals throughout.

General Discussion

We have discovered that we are able to provide a protective coating of molybdenum carbide on surfaces of various carbonaceous materials and that the molybdenum carbide coating not only protects the carbonaceous materials from attack by molten metal it also provides a wetting action for the intimate dispersal of molten metal with the carbonaceous material. These carbonaceous materials include all forms of carbon such as diamond; graphite particulate; graphite fibers, both continuous and discontinuous; lampblack; and carbon-rich surfaces. We have produced carbon-rich surfaces on silicon carbide and boron carbide as well as alumina, silicon nitride, and aluminum nitride to name a few.

The molybdenum carbide coating protects the carbonaceous material against attack by various molten metals while at the same time acting as a wetting agent for the infiltration or otherwise embedment of the carbonaceous material in a metal matrix. These metals include such metals as copper, aluminum, magnesium, iron, nickel, cobalt, titanium, silver, gold, platinum, rhodium, tin, zinc, and alloys of these metals. The resultant carbonaceous material/metal composite has any number of useful features depending upon, of course, the particular carbonaceous material/metal combination. For example, selected copper/graphite composites exhibit high thermal conductivity while retaining a very low degree of thermal expansion. Further, gold, silver, or platinum can be formed into a composite with graphite flakes to form an electrical contact with excellent electrical conductivity, low friction, and with a substantial reduction in the quantity of these precious metals required to create the electrical contact.

The process for producing the molybdenum carbide coating on the carbonaceous materials involves reacting the molybdenum in the gaseous phase with carbon on the surface of the carbonaceous material at an elevated temperature and under a controlled atmosphere. The elevated temperature causes the molybdenum compound to convert to the gaseous phase while the controlled atmosphere prevents the carbon surface of the carbonaceous material from being oxidized. While the primary protective coating for the carbonaceous material is molybdenum carbide it is to be understood that some of the molybdenum may be present in its metallic form. The controlled atmosphere can be a reduced pressure environment, an inert gas, or a reducing atmosphere such as hydrogen, carbon monoxide, or methane. For example if the molybdenum compound is molybdenum pentachloride then a reducing atmosphere is required in order to protect the carbonaceous material from attack. Customarily the process involves heating the molybdenum compound and the carbonaceous material to the reaction temperature and then flushing the reaction zone with the reducing atmosphere.

Detailed Description

Referring now to FIG. 1, one presently preferred process for producing the novel molybdenum carbide coating on a carbonaceous material is illustrated schematically herein and includes a coating chamber 10 into which is introduced the carbonaceous material 12 in combination with a vaporized molybdenum compound 14 and under a controlled atmosphere 16. Coating chamber 10 is heated by heat 18 to produce the desired reaction between the carbonaceous material 12 and the vaporized molybdenum compound 14, the reaction taking place under controlled atmosphere 16.

Carbonaceous material 12 is any suitable carbonaceous material and can include, for example, carbonaceous materials such as carbon; diamond; graphite fibers, both continuous and discontinuous; graphite particulate; lampblack, and carbon-rich surfaces. With the exception of the graphite fibers these carbonaceous materials are generally available in particulate form. However, the choice of carbon-rich surfaces also means that any suitable substrate can be produced as a carbon-rich surface. For example, we have found that silicon carbide lends itself admirably as a substrate for the carbon-rich surface. Silicon carbide is also known to be available in predetermined shapes as well as particulate and fibers. Other suitable substrate materials include, for example, boron carbide, alumina, silicon nitride, and aluminum nitride. In other words, it is presently postulated that one can provide a molybdenum carbide coating on almost any suitable substrate which is also amenable to having a carbon-rich surface formed thereon.

Vaporized molybdenum compound 14 is any suitable molybdenum compound such as molybdenum pentachloride, molybdenum trioxide, molybdenum alkoxide, and the like. The only known requirement of which we are presently aware at this stage is that the molybdenum be available in the gaseous state at the present temperatures of operation of coating chamber 10 by heat 18.

Controlled atmosphere 16 is any suitable atmosphere such as a reduced pressure, an inert gas or a reducing atmosphere such as hydrogen, carbon monoxide, methane, and the like. Importantly, controlled atmosphere 16 inhibits the undue oxidation of carbonaceous material 12 thereby allowing the molybdenum to react therewith to form the molybdenum carbide coating.

Heat 18 is any suitable source of thermal energy capable of producing the necessary temperatures in coating chamber 10 to achieve the desired reaction between vaporized molybdenum compound 14 with the surface of carbonaceous material 12.

EXAMPLE I

In this illustrative example, a carbon-rich surface was produced on silicon carbide fibers by immersing the silicon carbide fibers in A-240 pitch dissolved in toluene. The pitch-coated fibers were then dried and heated to 500° C. in an inert atmosphere where the pitch was converted to an amorphous carbon which formed the carbon-rich surface on the silicon carbide fibers.

EXAMPLE II

The carbon-rich surface produced on the silicon carbide fibers in Example I was heated to 700° C. under an atmosphere of molybdenum pentachloride and hydrogen. The resultant product was molybdenum carbide coated silicon carbide fibers.

EXAMPLE III

Discontinuous graphite fibers were introduced into coating chamber 10 as carbonaceous material 12 along with vaporized molybdenum pentachloride as molybdenum compound 14 and carbon monoxide as a reducing atmosphere for controlled atmosphere 16. After the application of heat 18 and subsequent cooling, the discontinuous fibers were found to have a continuous layer of a thin, silver-colored material. This layer was found upon analysis to be molybdenum carbide.

EXAMPLE IV

Graphite fibers were woven into a fabric and were heated in an atmosphere of a gaseous molybdenum pentachloride and a reducing agent. The graphite fibers in the fabric were coated with a layer of molybdenum carbide.

EXAMPLE V

Graphite fibers were heated in an atmosphere of gaseous molybdenum pentachloride and reducing agent. After removal from coating chamber 10 and cooling it was found that the graphite fibers had experienced a weight increase of about eleven percent, by weight, as a result of the formation of the molybdenum carbide on the surface of the graphite fibers.

EXAMPLE VI

Diamond particles were heated in coating chamber 10 in an atmosphere containing a gaseous molybdenum pentachloride and a reducing agent. Upon cooling it was found that the diamond particles were coated with a layer of molybdenum carbide.

EXAMPLE VII

Continuous graphite fibers as carbonaceous material 12 were heated in coating chamber 10 along with molybdenum trioxide to 700° C. until the molybdenum trioxide vaporized to produce vaporized molybdenum compound 14. The graphite fibers were then heated to 1100° C. in hydrogen as controlled atmosphere 16. When cooled, the fibers were found to be coated with a continuous layer of molybdenum carbide.

EXAMPLE VIII

In this example, a slightly different approach was taken in that graphite fibers were coated with a layer of molybdenum metal by sputtering in a vacuum. The metal-coated fibers were then heated until the molybdenum reacted with the graphite fibers to convert the coating to molybdenum carbide.

Figure 2:
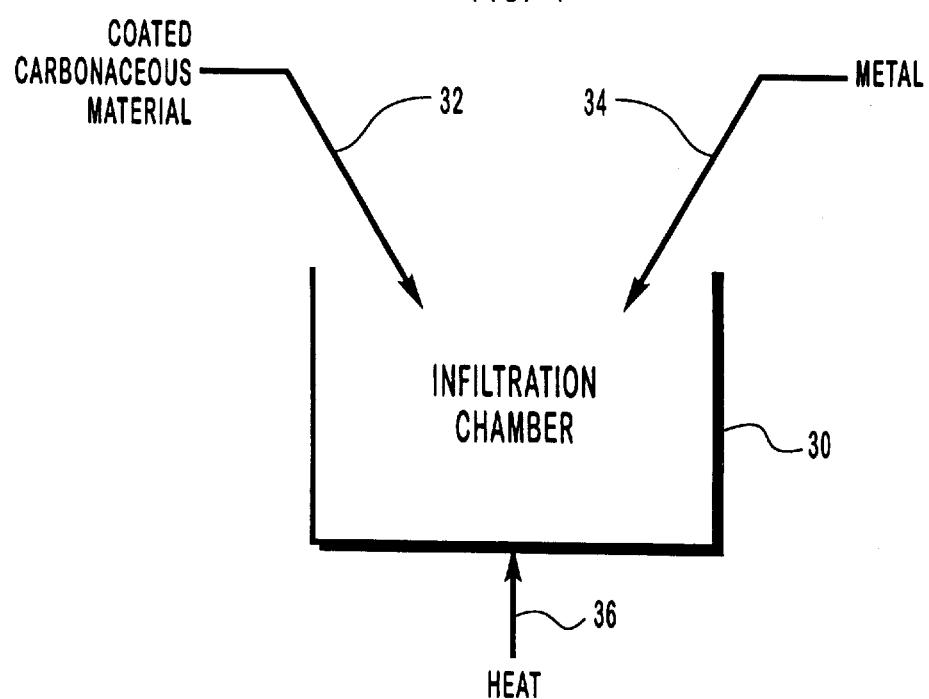
FIG. 2 is a schematic illustration of the apparatus for infiltrating metal into the molybdenum carbide coated carbonaceous materials.

Referring now to FIG. 2, one possible application of our novel invention is shown herein and includes an infiltration vessel 30 into which is placed a molybdenum carbide coated carbonaceous material 32 produced according to the process schematically illustrated in FIG. 1. Molybdenum carbide coated carbonaceous material 32 is heated by heat 36 in the presence of a metal 34. Advantageously, it was found that the molybdenum carbide coating not only protected the underlying carbonaceous material from attack by metal 34 in the molten state, but it also significantly enhanced the wetting action of metal 34 with coated carbonaceous material 32.

Figure 3:
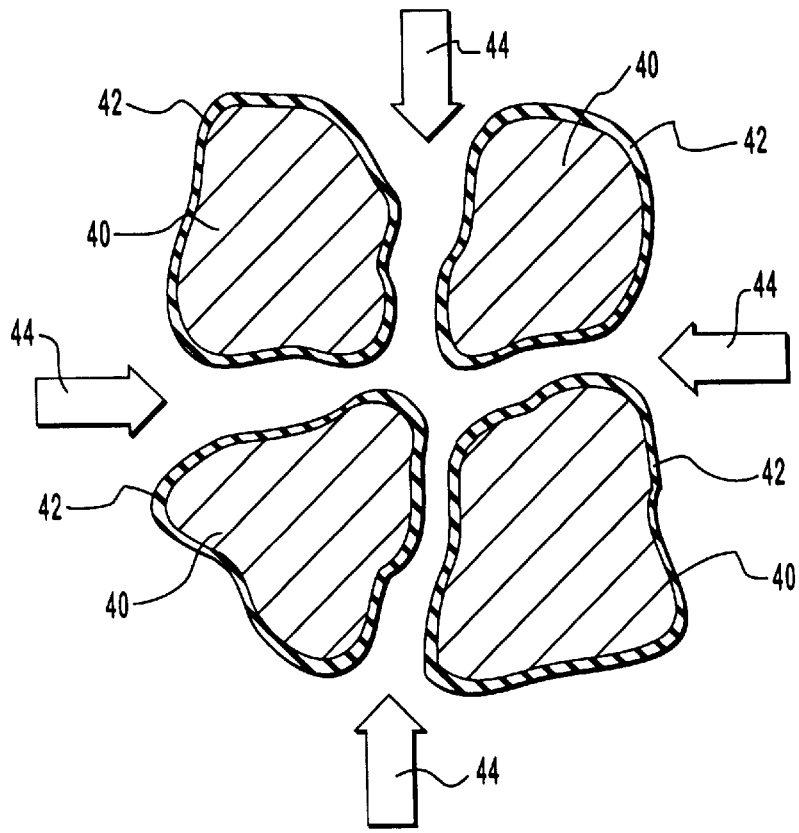
FIG. 3 is an enlarged, schematic illustration of molybdenum carbide coated carbonaceous material prior to infiltration by the molten metal.
Figure 4:
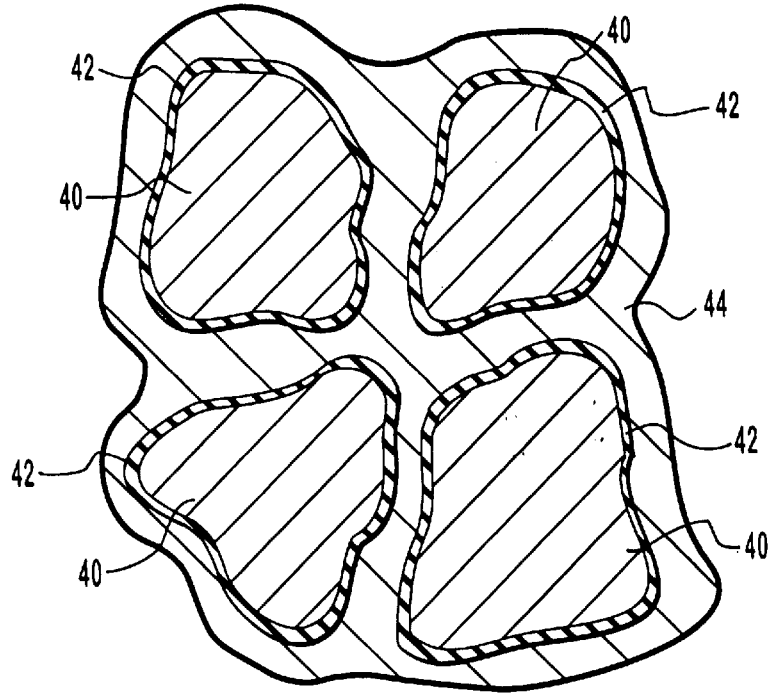
FIG. 4 is the enlarged, schematic illustration of the molybdenum carbide coated carbonaceous material of FIG. 3 infiltrated with metal.

With reference also to FIGS. 3 and 4, this protection and wetting of molybdenum carbide coated carbonaceous material is shown schematically as carbonaceous material 40 having a coating of molybdenum carbide 42 formed thereon. As shown herein, carbonaceous material 40 is shown as a particulate greatly enlarged for ease of illustration and having an irregular external profile. However, it is to be clearly understood that carbonaceous material 40 can be any suitable carbonaceous material having any suitable shape such as particulate; preformed shapes; and as fibers, both continuous and discontinuous, which can be provided as discrete fibers, woven fibers, and even nonwoven felt-like substrates. Advantageously, we have found that we are able to produce molybdenum carbide coating 42 on any shape of carbonaceous material 40.

With carbonaceous material 40 suitably coated with molybdenum carbide 42 it is both protected from attack by molten metal 44 as well as wetted for intimate dispersal of molten metal 44 throughout the interstices of carbonaceous material 40 and its molybdenum carbide coating 42. This infiltration with molten metal 44 is shown schematically at FIG. 3 whereas FIG. 4 schematically illustrates the intimate wetting action between molten metal 44 and molybdenum carbide 42 coating on carbonaceous materials 40.

EXAMPLE IX

The molybdenum carbide coated discontinuous graphite fibers produced according to the process of Example III were placed in contact with molten copper where they absorbed the molten copper by capillary action to form a copper/graphite composite material. This resulting composite had a density of 7.2 grams/cubic centimeter. It also had excellent thermal conductivity and a lower coefficient of thermal expansion than pure copper.

EXAMPLE X

The woven graphite fabric coated with molybdenum carbide according to Example IV was heated in contact with copper until the copper melted. The molten copper completely infiltrated the fabric forming a copper/graphite composite material having 40 percent, by volume, graphite fibers. This composite had a thermal expansion coefficient of 4 to 7 parts per million per degree Celsius. It also exhibited excellent thermal conductivity which would make it an excellent substrate for mounting silicon-based integrated circuits.

EXAMPLE XI

The molybdenum carbide coated graphite fibers produced according to Example V were heated in contact with copper where it was found that the molten copper spontaneously wet and infiltrated the fibers forming a copper/graphite composite.

EXAMPLE XII

To evaluate the efficacy of the molybdenum carbide coating in enhancing the wetting capability with molten copper, graphite fibers were heated in an atmosphere of gaseous molybdenum compound and reducing agent as set forth in Example V with the exception that the coating reaction was limited to only produce a weight increase of the fibers of two percent, by weight. When heated in contact with copper, the molten copper did not wet and infiltrate the fibers. Microscopic examination of the fibers revealed regions which were not completely coated with a layer of molybdenum carbide.

EXAMPLE XIII

The molybdenum carbide coated diamond particles produced according to Example VI were heated in the presence of a copper alloy which wetted and infiltrated throughout the particles. The resultant diamond/copper alloy composite material was found suitable for use as a grinding or cutting material.

EXAMPLE XIV

The molybdenum carbide coated continuous graphite fibers produced according to Example VII were heated in a graphite mold with copper in a ratio of 2.0 grams of coated fibers to 8.9 grams of copper. Both were heated to 1,100° C. whereupon the copper spontaneously infiltrated the fibers producing a copper/graphite composite containing 50 volume percent graphite fiber and having a density of approximately 5.5 grams/cubic centimeter.

EXAMPLE XV

The molybdenum carbide coated graphite fibers produced according to Example VIII were heated with copper to produce a copper/graphite composite.

Other metals that could be used in producing composites according to the teachings of our invention include the metals of aluminum, magnesium, iron, nickel, cobalt, titanium, silver, gold, platinum, rhodium, tin, and zinc, and the alloys of these metals. However, regardless of the metal or metal alloy employed as metal 44, the carbonaceous material must be suitably coated with molybdenum carbide to both protect the carbonaceous material from attack by the molten metal as well as wet the carbonaceous material for infiltration by the molten metal.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for coating a carbonaceous material with a molybdenum carbide coating comprising the steps of:

selecting the carbonaceous material;

placing said carbonaceous material under a controlled atmosphere, said controlled atmosphere comprising an atmosphere selected from the group consisting of a reduced pressure environment, an inert gas and a reducing atmosphere of hydrogen, carbon monoxide, or methane;

introducing a gaseous molybdenum compound into said carbonaceous material under said controlled atmosphere;

reacting molybdenum from said gaseous molybdenum compound with carbon on the surface of said carbonaceous material to form the molybdenum carbide coating on said carbonaceous material; and infiltrating a molten metal into said carbonaceous material, said molybdenum carbide coating protecting said carbonaceous material from said molten metal while providing a wetting action for the molten metal to infiltrate the carbonaceous material.

2. The method defined in claim 1 wherein said selecting step includes selecting said carbonaceous material from the group consisting of diamond, graphite particulate, graphite fibers, lampblack, and carbon-rich surfaces.

3. The method defined in claim 1 wherein said gaseous molybdenum compound is selected from the group consisting of molybdenum pentachloride, molybdenum trioxide, and molybdenum alkoxide.

4. The method defined in claim 1 wherein said molten metal is selected from the group consisting of copper, aluminum, magnesium, iron, nickel, cobalt, titanium, silver, gold, platinum, rhodium, tin, zinc, and alloys of said copper, aluminum, magnesium, iron, nickel, cobalt, titanium, silver, gold, platinum, rhodium, tin, and zinc.

* * * * *